US009559578B2

(12) United States Patent
Schrom et al.

(10) Patent No.: US 9,559,578 B2
(45) Date of Patent: Jan. 31, 2017

(54) APPARATUS AND SYSTEM FOR GENERATING A SIGNAL WITH PHASE ANGLE CONFIGURATION

(75) Inventors: Gerhard Schrom, Hillsboro, OR (US); Naravanan Raghuraman, Beaverton, OR (US); Fabrice Paillet, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 210 days.

(21) Appl. No.: 13/995,113

(22) PCT Filed: Dec. 23, 2011

(86) PCT No.: PCT/US2011/067231
§ 371 (c)(1),
(2), (4) Date: Jun. 17, 2013

(87) PCT Pub. No.: WO2013/095649
PCT Pub. Date: Jun. 27, 2013

(65) Prior Publication Data
US 2014/0136860 A1    May 15, 2014

(51) Int. Cl.
*H02M 1/14*    (2006.01)
*H03K 4/06*    (2006.01)
(Continued)

(52) U.S. Cl.
CPC .................. *H02M 1/14* (2013.01); *G06F 1/26* (2013.01); *H03K 4/06* (2013.01); *H03K 7/08* (2013.01);
(Continued)

(58) Field of Classification Search
CPC .......... H02M 1/14; H02M 1/143; H02M 1/15; H02M 3/04; H02M 3/156; H02M 3/157; H02M 3/1584; H02M 2003/1586; H03K 4/06; H03K 4/026
See application file for complete search history.

(56) References Cited

U.S. PATENT DOCUMENTS 4,926,131 A * 5/1990 Leydier ......................... 327/126
6,377,094 B1 4/2002 Carley
(Continued)

FOREIGN PATENT DOCUMENTS

EP    0296966    12/1988
GB    2468988 A    9/2010

OTHER PUBLICATIONS

International Preliminary Report on Patentability for corresponding International Application No. PCT/US2011/067231, mailed on Jul. 3, 2014, 12 pages.
(Continued)

*Primary Examiner* — Fred E Finch, III
(74) *Attorney, Agent, or Firm* — Blakely, Sokoloff, Taylor & Zafman LLP

(57) ABSTRACT

Described herein is an apparatus and system for generating a signal with phase angle configuration. The apparatus comprises an array of switch-resistors, each switch resistor to receive a control signal, wherein the array of switch-resistors to generate an output signal; and a circuit to configure phase angle of the output signal. The apparatus can be used for different package and inductor configurations. The apparatus provides flexibility to mitigate switching noise by adjusting phase angles, and provides the ability to enable and disable switch-resistors on the fly without ripples. The apparatus also saves power consumption by selectively turning off switch-resistors when phases are disabled. The output signal of the apparatus has smooth triangular waveforms for improving the quality of power supply generated using the output signal. Overall, the appa- (Continued)

ratus exhibits reduced sensitivity to process variations compared to traditional signal generators.

23 Claims, 13 Drawing Sheets

(51) Int. Cl.
*G06F 1/26* (2006.01)
*H03L 7/00* (2006.01)
*H03K 7/08* (2006.01)
*H02M 3/158* (2006.01)
*H03H 7/32* (2006.01)
*H03H 11/26* (2006.01)
*H03K 5/13* (2014.01)
*H03K 3/03* (2006.01)

(52) U.S. Cl.
CPC ........ *H03L 7/00* (2013.01); *H02M 2003/1586* (2013.01); *H03H 7/325* (2013.01); *H03H 11/265* (2013.01); *H03K 3/0315* (2013.01); *H03K 5/133* (2013.01)

(56) References Cited

U.S. PATENT DOCUMENTS

| | | | |
|---|---|---|---|
| 6,801,028 B2 | 10/2004 | Kernaham et al. | |
| 7,557,622 B2 * | 7/2009 | Stanley | 327/131 |
| 8,810,294 B2 * | 8/2014 | Lynch et al. | 327/172 |
| 2002/0009170 A1 | 1/2002 | Schmatz | |
| 2004/0263227 A1 * | 12/2004 | Baker | H03K 5/133 327/158 |
| 2005/0264336 A1 | 12/2005 | Kang | |
| 2006/0033553 A1 * | 2/2006 | Hazucha et al. | 327/530 |
| 2007/0290664 A1 * | 12/2007 | Moyer et al. | 323/272 |
| 2008/0100371 A1 * | 5/2008 | Paillet et al. | 327/543 |
| 2008/0143407 A1 * | 6/2008 | Schrom et al. | 327/172 |
| 2008/0238390 A1 * | 10/2008 | Trivedi et al. | 323/283 |
| 2011/0037502 A1 * | 2/2011 | Nakano et al. | 327/105 |
| 2012/0081091 A1 * | 4/2012 | Ito | 323/282 |
| 2013/0063101 A1 * | 3/2013 | Nene | 323/234 |

OTHER PUBLICATIONS

First Notification for Rectification issued for Chinese Patent Application No. 20130617205.5, mailed Mar. 10, 2014, 4 pages.
International Search Report and Written Opinion issued for International Patent Application No. PCT/US2011/067231, mailed on Nov. 29, 2012, 16 pages.
First Rectification Notification issued for Chinese Utility Model Patent Application No. 201220716515.8, mailed Apr. 12, 2013, 4 pages.
Second Notification for Rectification issued for Chinese Patent Application No. 201320617205.5, mailed Aug. 25, 2014, 3 pages.
Taiwan Appln. No. 101148107 Office Action, May 23, 2015, 17 pgs.
Taiwan (R.O.C.) Patent Application No. 101148107, Notice of Allowance mailed Oct. 13, 2015, (Letter) + (Allowed Claims in English), 8 pages.
Extended European Search Report for European Patent Application No. 11877725.9 mailed Sep. 21, 2015, 7 pages.

* cited by examiner

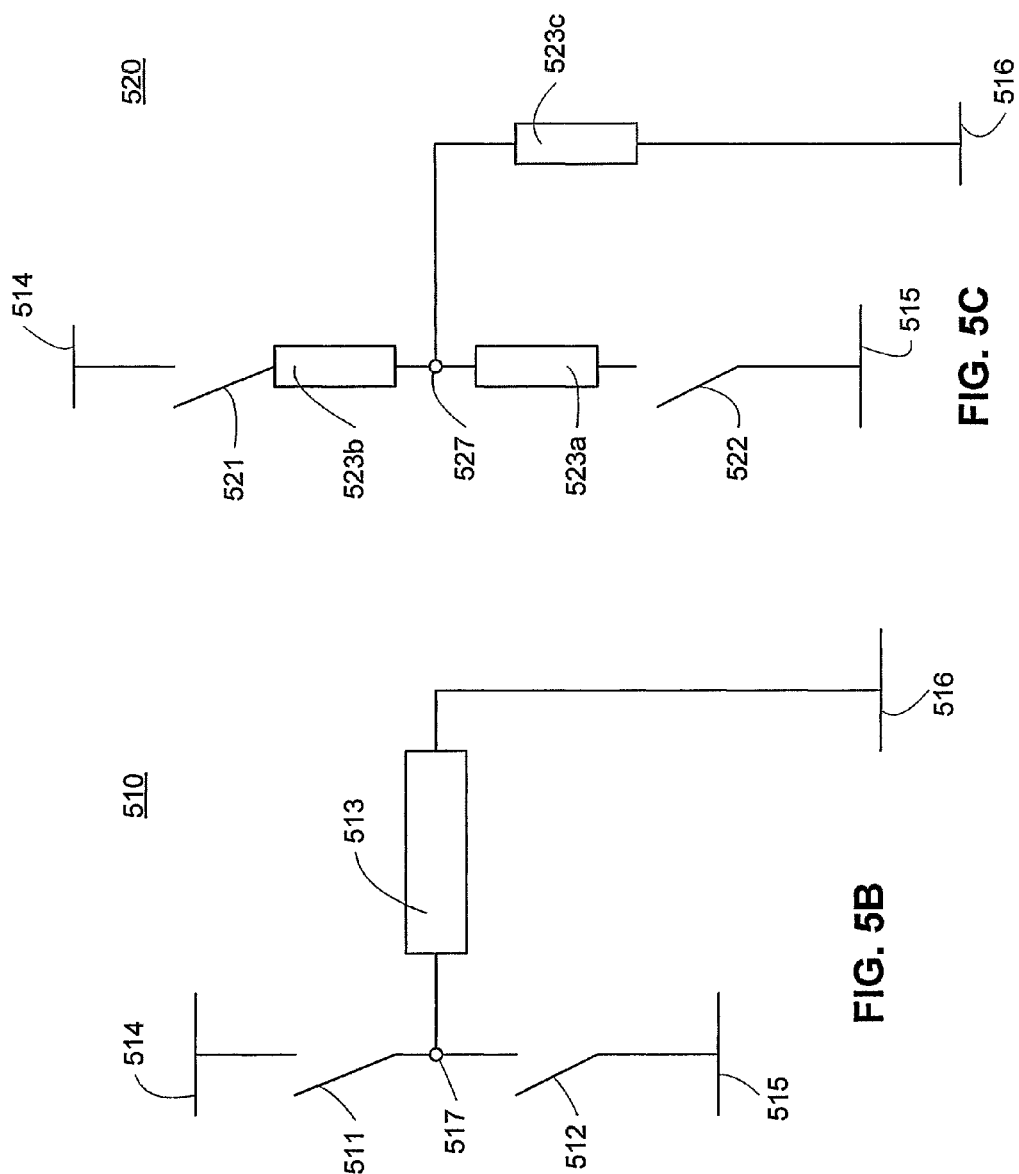

APPARATUS AND SYSTEM FOR GENERATING A SIGNAL WITH PHASE ANGLE CONFIGURATION

CLAIM OF PRIORITY

This application claims the benefit of priority of International Patent Application No. PCT/US2011/067231 filed Dec. 23, 2011, titled "APPARATUS AND SYSTEM FOR GENERATING A SIGNAL WITH PHASE ANGLE CONFIGURATION," which is incorporated by reference in its entirety.

FIELD OF THE INVENTION

Embodiments of the invention relate generally to the field of signal generators. More particularly, embodiments of the invention relate to an apparatus and system for generating a signal with phase angle configuration.

BACKGROUND

A power converter, such as a Direct Current (DC) to DC (DC-DC) power converter, for a processor may provide a voltage supply to the processor. The power converter may be driven by a signal generating circuit. The signal generators for power converters have a fixed phase angle assignment for each phase. These phases cannot be enabled or disabled safely on the fly, i.e. enabling or disabling the phases causes ripples in the signal generated for the power converter by the signal generator.

Such ripples compromise the stability of the power converters and the voltage supplied by the power converters. The fixed phase angle assignments also impede re-use of the signal generator for different package and inductor configurations.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIGS. 5B-C are high level architectures of switch-resistors, according to one embodiment of the invention.

DETAILED DESCRIPTION

Figure 1:
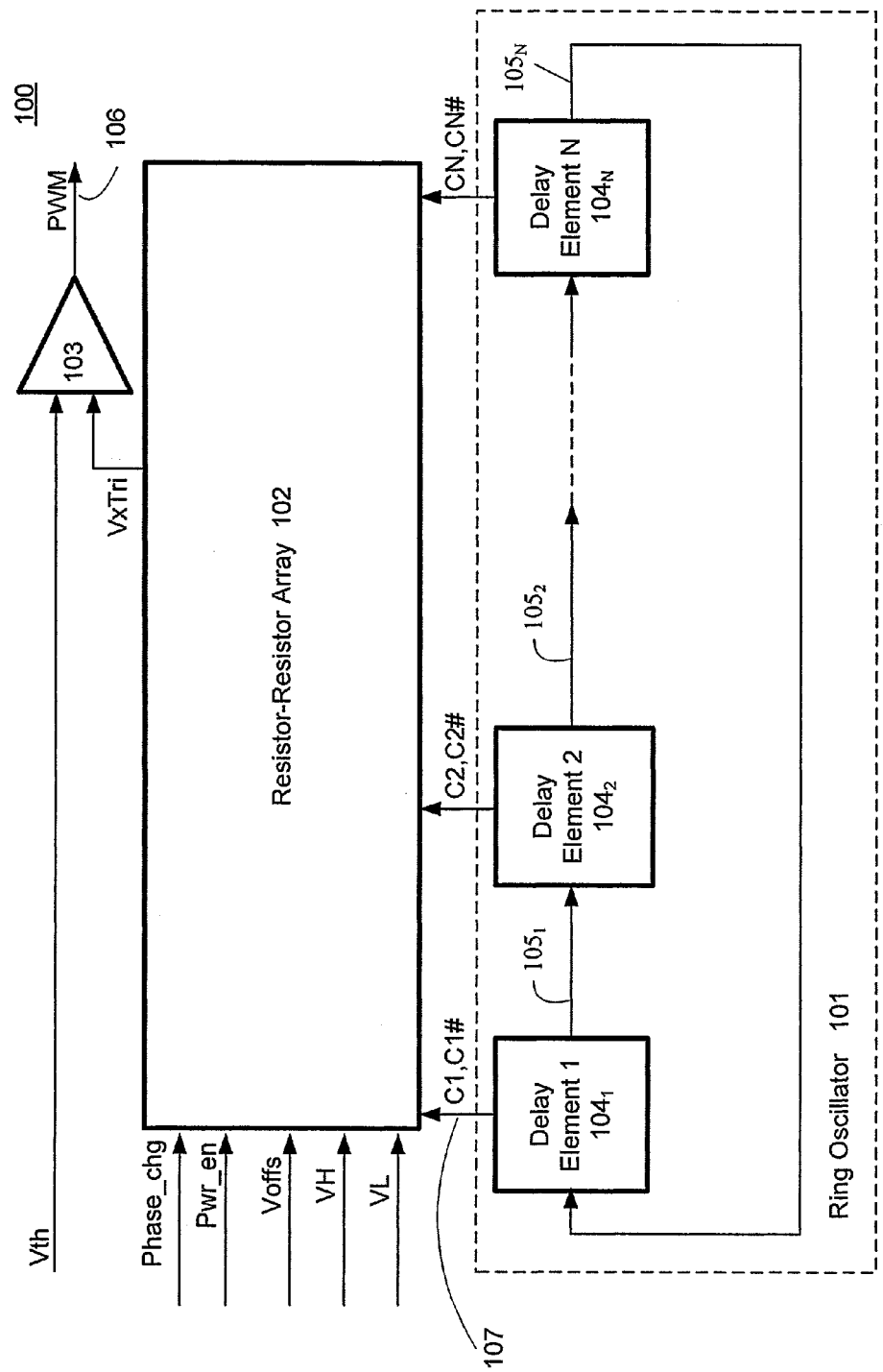
FIG. 1 is a block level architecture of a signal generator, according to one embodiment of the invention.

Embodiments of the invention relate to an apparatus and system for generating a signal with phase angle configuration. In one embodiment, the apparatus comprises: an array of switch-resistors, each switch resistor to receive a control signal, wherein the array of switch-resistors is operable to generate an output signal. In one embodiment, the apparatus further comprises a circuit to configure phase angle of the output signal. In one embodiment, the apparatus further comprises a phase angle adjustment circuit for adjusting the phase angle of any waveforms generated by the array of switch resistors. In one embodiment, the output signal is a pulse width modulated (PWM) signal which is smooth, i.e. without stair-case like waveform.

In one embodiment, the phase angle adjustment circuit generates a synchronization signal according to a set phase angle. In one embodiment, synchronization signal may have the rising/falling edges at 25%/75% of a voltage regulator (VR) switching period. In another embodiment, the synchronization signal may have rising/falling edges at 75%/25% of a VR switching period. In one embodiment, the apparatus further comprises a circuit for generating a signal for enabling or disabling a switch VR phase at a time according to the set phase angle.

In one embodiment, the array of switch-resistors comprises rows and columns of switch-resistors which are operable to be enabled or disabled via a signal generated by a circuit. In such an embodiment, switch-resistors generating phases which are not being used are disabled to save power consumption of the apparatus. In one embodiment, the same signal may be used to power down a comparator(s) of the apparatus. In one embodiment, the signal for enabling/disabling a row or column of the switch-resistor array (or matrix) is generated according to the set phase angle and may be derived from the synchronization signal.

In one embodiment, each row or column of the switch-resistor array is operable to be driven by complementary signals generated by a ring oscillator (RO). In one embodiment, the RO comprises delay elements connected in a series with one another to cause the RO to oscillate at a particular frequency. In one embodiment, each delay element of the RO comprises two delay cells, one for generating signals for driving another delay element in the RO while the other delay cell to generate the complementary control signals for driving a column of the switch-resistor array. In one embodiment, the slew rate of the complementary control signals speed up and down with increasing and decreasing RO frequency, respectively.

The term "slew rate" herein refers to rise and/or fall times of a signal measured at 10% or 20% and 90% or 80% of the rising or falling edges of the signal. The measuring marks of 10%, 20%, 80%, and 90% are provided as examples. Other measuring marks are can also be used for measuring the slew rate.

In one embodiment, each switch-resistor cell in the array of switch-resistors forms a resistive connection to a node carrying the output signal from either a node carrying the high voltage supply (VH) or the node carrying the low voltage supply (VL).

The technical effects of the embodiments discussed herein are many. For example, the signal generator described herein can be used for different processor package and inductor configurations. The signal generator described herein provides flexibility to mitigate switching noise on the output signal by adjusting phase angles, and provides the ability to enable and disable switch-resistors on the fly without generating ripples on the output signal. The signal generator described herein also saves power consumption by selectively turning off switch-resistors when phases are disabled. The output signal of the signal generator described herein has smooth triangular waveforms (i.e., no stair case effect) for improving the quality of power supply generated using the output signal. Overall, the signal generator described herein exhibits reduced sensitivity to process variations compared to traditional signal generators. The above technical effects are not limiting in any way. Other technical effects are contemplated by the embodiments discussed herein.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is a block level architecture of a signal generator 100, according to one embodiment of the invention. In one embodiment, the signal generator comprises a RO 101 coupled to a array of switch-resistors 102, wherein the RO 101 is configured to provide control signals C1, C1#, C2, C2#, . . . CN, CN#, where N is an integer, and where "#" indicates complementary version of the signal, for example, C1# is complementary (inverted) version of C1 signal.

In one embodiment, the RO 101 comprises delay elements 104$_{1-N}$ connected with one another to form a closed loop ring, i.e. output 105$_1$ of delay element 104$_1$ is input to delay element 104$_2$, and so on till the last delay element 105$_N$ in the chain of delay elements drives its output 105$_N$ to the first delay element 104$_1$. In one embodiment, an inverting buffer is placed between the delay element 105$_N$ and the first delay element 105$_1$. The RO 101 oscillates at a frequency, herein referred to the RO frequency. In one embodiment, a delay locked loop (DLL) with adjustable delays can be used as the RO 101.

So as not to obscure the embodiments of the invention, controls signals C1 and C1# 107 are described herein. The same description is applicable to other control signals from the RO 101.

In the embodiments discussed herein, the control signal 107 comprises complementary signals—C1 is complementary of C1#. These complementary signals have smooth slopes (rising and falling edges) which, in part, cause the array of switch-resistors 102 to generate an output signal VxTri with smooth slopes, i.e. smooth rising and falling edges and without (i.e., independent of) stair case type rising and falling edges.

In one embodiment, the smooth slopes of the control signal 107 are generated by having at least two differential delay cells in the delay element 104$_1$ such that the first differential delay cell receives an input, for example, 105$_N$, and generates an output 105$_1$ which is also used as input to a second differential delay cell which generates the output signal 107. The embodiments of a delay element are discussed herein with reference to FIGS. 2-4.

Referring back to FIG. 1, as discussed herein, each of the delay elements (104$_{1-N}$) provides a separate control signal to a column of switch-resistors in the array of switch-resistors 102. For example, the delay element 104$_1$ may provide the control signal 107 to a coefficient circuit (not shown), of a switch-resistor within a column of the array of switch-resistors 102, which in turn provides a signal to an adder circuit (not shown) of that column within the array of switch resistors.

In one embodiment, the adder circuit of the column adds the signal received from the coefficient circuit with an offset voltage Voffs (or offset voltage signal) and provides a signal to a following adder circuit of the following column of switch-resistors in the switch-resistor array 102. The following adder circuit adds the signal received from the adder circuit with the signal received from another coefficient circuit and provides a signal to the next adder circuit of a next column and provides an output analog signal VxTri (or output waveform). The output analog signal VxTri is therefore based on the offset voltage Voffs and a sum of outputs from the adder circuits in each column of switch-resistors in the switch-resistor array 102.

In the embodiments discussed herein, the output analog signal VxTri is a periodic waveform. In one embodiment, the output analog signal VxTri is periodic sinusoidal signal. In another embodiment, the output analog signal VxTri is a periodic triangular signal. In the embodiments discussed herein, the output analog signal VxTri is a smooth signal with smooth rising and falling edges, i.e. VxTri is not a stair case signal.

In one embodiment, the array of switch-resistors 102 is operable to receive VH and VL voltage supplies. In one embodiment, the VH and VL voltage supplies are provided by a high voltage level shifter HVLS (not shown).

In one embodiment, the signal generator 100 comprises a comparator 103 which is operable to receive a threshold voltage Vth (or threshold voltage signal) at a positive input terminal and receives the output analog signal Vxtri from the switch-resistor array 102 at a negative input terminal of the comparator 103. The notation "Vth" is also referred herein as "Vfb." In one embodiment, the Vth and Vxtri signals can be coupled to negative and positive input terminals of the comparator 103 respectively without changing the essence of the embodiments of the invention. In one embodiment, the comparator circuit 103 provides the PWM signal 106 based on the comparison of the input signals to the comparator circuit 103. In one embodiment, the PWM signal 106 may be applied to a power converter. The power converter may use the PWM signal, for example, to control power switching transistors.

In one embodiment, a duty cycle of the PWM signal 106 may depend on a shape and amplitude of the output analog signal VxTri and the threshold voltage Vth. The term "duty cycle" herein refers to a ratio of a high phase to a low phase of a periodic signal. For example, a 50% duty cycle refers to a low phase and high phase in a period of a signal being of the same duration. A 25% duty cycle refers to the low phase being 25% of the period of the signal while 75% of the period of the signal is the high phase.

In one embodiment, when coefficients of the coefficient circuits cause the output analog signal VxTri to be a periodic triangular signal having a peak-to-peak amplitude of A, the duty cycle D of the resulting PWM signal 106 may be D=(Vth−Voffs)/A. In one embodiment, the duty cycle of the PWM signal 106 may also be altered by increasing or decreasing a level of the offset voltage Voffs.

In one embodiment, the switch-resistor array 102 receives a phase change signal (Phase_chg) from a phase angle adjustment circuit (see FIGS. 8-9) for adjusting the phase angle of any waveforms generated by the array of switch-resistors 102. In one embodiment, the phase angle adjustment circuit generates a synchronization signal according to a set phase angle. In one embodiment, synchronization signal may have rising/falling edges at 25%/75% of a VR switching period. In another embodiment, the synchronization signal may have rising/falling edges at 75%/25% of a VR switching period. In one embodiment, the signal generator 100 further comprises a circuit for generating a signal for enabling or disabling a switch VR phase at a time according to the set phase angle.

As discussed herein, the array of switch-resistors 102 comprises rows and columns of switch-resistors. In one embodiment, the rows and/or columns of the array of switch-resistors 102 are operable to be enabled or disabled via a signal (Pwr_en) generated by a circuit. In such an embodiment, switch-resistors within the array generating phases which are not being used are disabled to save power consumption of the signal generator 100. In one embodiment, the same signal may be used to power down the comparator(s) 103. In one embodiment, the signal for enabling/disabling a row and/or column of the switch-resistor array (or matrix) 102 is generated according to the set phase angle and may be derived from the synchronization signal.

Figure 2:
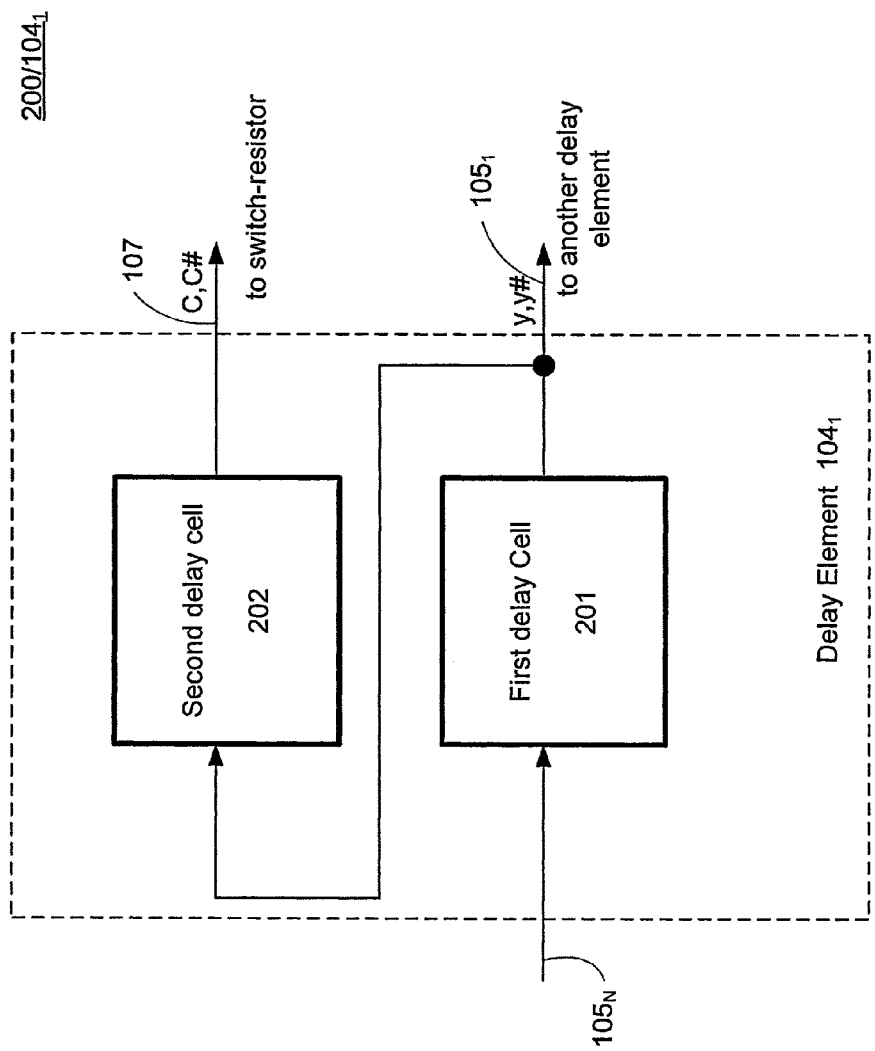
FIG. 2 is a block level architecture of a delay element in the signal generator, according to one embodiment of the invention.

FIG. 2 is a block level architecture 200 of a delay element $104_1$ in the RO 101 of the signal generator 100, according to one embodiment of the invention. FIG. 2 is described with reference to FIG. 1. While FIG. 2 is described for the delay element $104_1$, the same architecture is applicable to other delay elements in the RO 101. In one embodiment, the control signal 107 has smooth rising and falling edges by having two delay cells in the delay element $104_1$. In one embodiment, the first delay cell 201 receives an input signal $105_N$ from another delay element in the RO 101. In one embodiment, the output $105_1$ of the first delay cell 201 is received as input by a second delay cell 202, wherein the second delay cell 202 has a circuit design which is the same as the circuit design of the first delay cell 201. The output $105_1$ of the first delay cell 201 is received by another delay element (e.g., $104_2$) in the RO 101.

Figure 3:
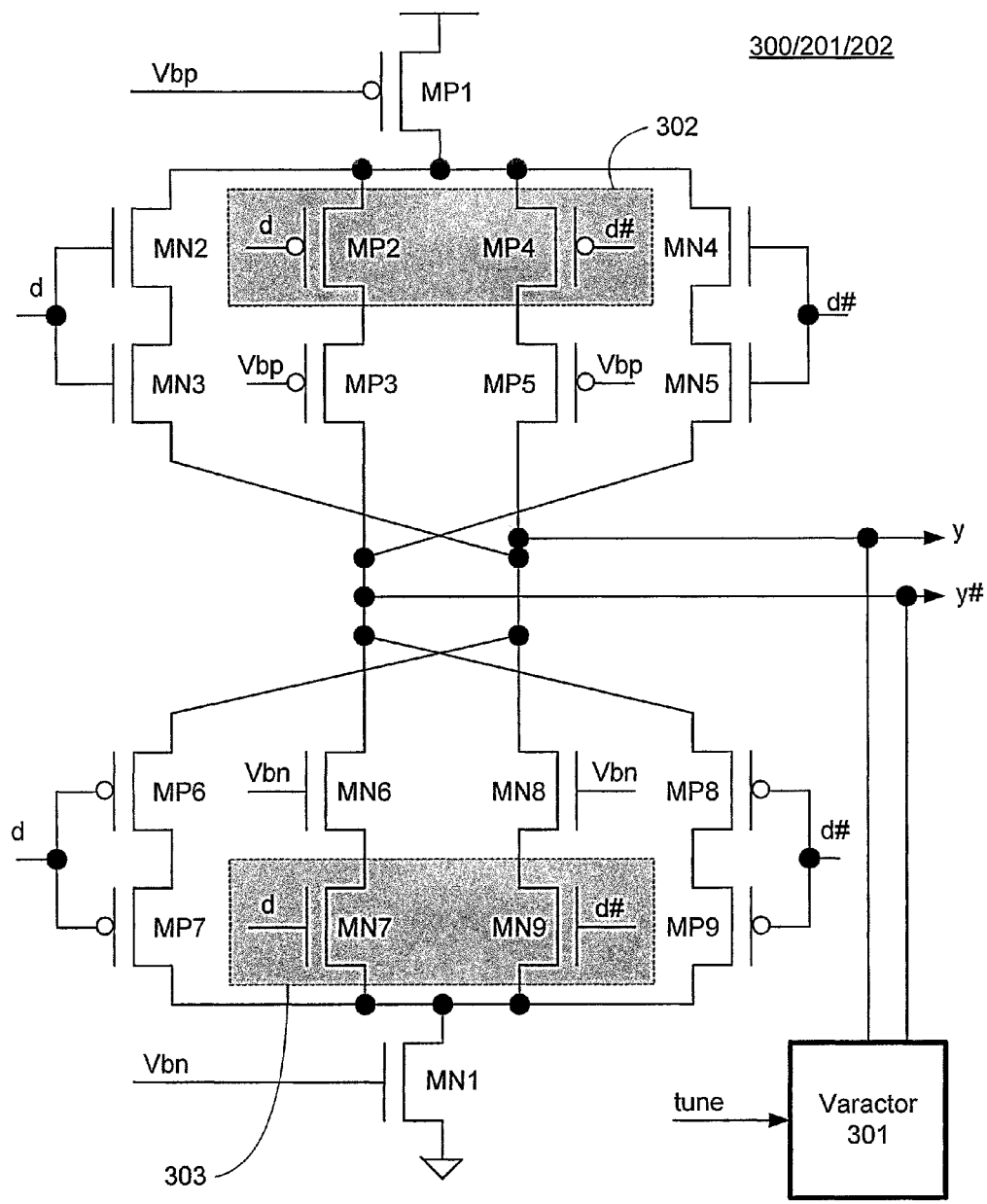
FIG. 3 is a schematic of the delay element, according to one embodiment of the invention.

In one embodiment, the second delay cell 202 generates the control signal 107 which is received by a column of switch-resistors of the switch-resistor array 102. The control signal 107 has a slew rate which increases when the frequency of the RO 101 increases. In one embodiment, the slew rate of the controls signal 107 increases when vtune (also referred herein as "tune"), discussed with reference to FIG. 3, is increased and/or when Vbn is increased and Vbp is reduced. In such an embodiment, Vbp is indirectly controlled by a bias current provided by transistors MN1/MP1 which are part of current mirrors. As the slew rate of y and y# increases, i.e. slew rate of the control signal 107, the delay from signals d/d# to y/y# is reduced, which results in higher frequency.

Referring back to FIG. 2, in one embodiment, the signals $105_N$, $105_1$ and 107 are differential signals. In such an embodiment, the first and second delay cells 201 and 202 respectively are differential delay cells which are discussed herein with reference to FIG. 3.

FIG. 3 is a schematic of the delay cell 300/201/202, according to one embodiment of the invention. FIG. 3 is described with reference to FIGS. 1-2. So as not to obscure the embodiments of the invention, the delay cell 300 is described for the delay element $105_1$. The same architecture applies to other delay cells discussed herein. For purposes of the embodiments described herein, the transistors are metal oxide semiconductor (MOS) transistors, which include drain, source, and gate terminals. However, those skilled in the art will appreciate that other transistors may be used without departing from the scope of the invention.

The embodiment discussed herein is a differential delay cell 300. The inputs to the delay cell 300 are signals d and d#, while the output signals are y and y#. The term "signal y" and "signal y#" are interchangeably used to refer to node y and y#, which carry signals y and y#. In one embodiment, signals d and d# are complementary signals received by the first delay cell 201, where signals d and d# correspond to delay element input signals $105_1$. In one embodiment, signals d and d# are complementary signals, i.e. complementary of one another, received by the second delay cell 202, where signals d and d# are the same as delay element output signals $105_2$. In one embodiment, signals y and y# are complementary signals provided by the first delay cell 201. The signals y and y# correspond to output signals $105_2$ from the delay element $104_1$, and where output signals y and y# are complementary signals with smooth rising and falling edges. In one embodiment, signals y and y# are complementary signals provided to the second delay cell 202 which generates complementary control signals 107.

In one embodiment, other inputs to the delay cell 300 are signals including Vbn and Vbp, where signal Vbn is a bias voltage signal for n-type MOS (NMOS) transistors while Vbp is a bias voltage signal for p-type MOS (PMOS) transistors. In one embodiment, the bias signals Vbn and Vbp are generated by a bias generator (not shown). In one embodiment, the bias generator comprises a band-gap circuit. In other embodiments, other forms of bias generators may be used without changing the scope of the embodiments of the invention.

In one embodiment, a tunable varactor 301 is coupled to the output nodes carrying the signals y and y#. In such an embodiment, the varactor provides a variable capacitance to signals y and y#, where the variable capacitance is a function of the voltage signal, tune. An embodiment of a varactor 301 is described with reference to FIG. 4. In one embodiment, the delay cell 300 does not have any varactor coupled to the output nodes carrying the signals y and y#.

In the embodiments discussed herein the delay cell 300 comprises a PMOS differential pair 302 and an NMOS differential pair 303.

In one embodiment, the delay cell 300 comprises a PMOS differential pair 302 which comprises PMOS transistors MP2 and MP4 that receive differential signals d and d# respectively. A PMOS current source MP1, coupled between a power supply and the PMOS differential pair 302, is biased by Vbn, where MP1 provides current to the PMOS differential pair 302. In one embodiment, the power supply is a separate power supply than VH and/or VL which provides the capability to power down the delay cell 300 when a corresponding switch-resistor (for which the control signals y and y# are being generated) is not being used.

The PMOS transistors MP2 and MP4 of the PMOS differential pair 302 are coupled in cascode (in series) with PMOS transistors MP3 and MP5 respectively. In one embodiment, PMOS transistors MP3 and MP5 are biased by bias voltage Vbp. In one embodiment, the source terminals of the PMOS transistors MP3 and MP5 are coupled to output nodes which carry signals y and y# respectively.

In one embodiment, the NMOS differential pair 303 comprises NMOS transistors MN7 and MN9 that receive complementary signals d and d# at their respective gate terminals. In one embodiment, the NMOS differential pair 303 is provided via their source terminals with a current tail source via transistor MN1 which is biased by Vbn at its gate terminal. In one embodiment, cascode NMOS transistors MN6 and MN8 are coupled in series with the NMOS differential pair 303 transistors MN7 and MN9 respectively. In one embodiment, the cascode NMOS transistors MN6 and MN8 are biased by the bias signal Vbn which is coupled to their gate terminals. In one embodiment, the drain terminals of the NMOS cascode transistors MN6 and MN8 are coupled to output nodes which carry signals y# and y respectively.

In one embodiment, a pair of NMOS transistors MN2 and MN3, which are coupled together in series, couple the drain terminal of the PMOS current source MP1 and the output node carrying the signal y, such that the source terminal of MN3 is coupled to the output node carrying the signal y, and the drain terminal of MN2 is coupled to the drain terminal of the PMOS current source MP1, wherein the pair of NMOS transistors MN2 and MN3 receive the input signal d at their respective gate terminals.

In one embodiment, a pair of NMOS transistors MN4 and MN5, which are coupled together in series, couple the drain terminal of the PMOS current source MP1 and the output node carrying the signal y#, such that the source terminal of MN5 is coupled to the output node carrying the signal y#, and the drain terminal of MN4 is coupled to the drain terminal of the PMOS current source MP1, wherein the pair of NMOS transistors MN4 and MN5 receive the input signal d# at their gate terminals.

In this embodiment, transistors MN2, MN3 and MN4, MN5 are operated as source-followers to enhance the linearity of the waveforms of the signals y and y#. Coupling the two transistors (MN2, MN3 and MN4, MN5) in series emulates a long-channel transistor device. A person skilled in the art is aware of the benefits a long-channel transistor as used in analog design.

In one embodiment, a pair of PMOS transistors MP6 and MP7, which are coupled together in series, couple the drain terminal of the NMOS tail current source MN1 and the output node carrying the signal y, such that the drain terminal of MP6 is coupled to the output node carrying the signal y, and the source terminal of MP7 is coupled to the drain terminal of the NMOS tail current source MN1, wherein the pair of PMOS transistors MP6 and MP7 receive the input signal d at their gate terminals.

In one embodiment, a pair of PMOS transistors MP8 and MP9, which are coupled together in series, couple the drain terminal of the NMOS tail current source MN1 and the output node carrying the signal y#, such that the drain terminal of MP8 is coupled to the output node carrying the signal y#, and the source terminal of MP9 is coupled to the drain terminal of the NMOS tail current source MN1, wherein the pair of PMOS transistors MP8 and MP9 receive the input signal d at their respective gate terminals. The differential delay cell 300 of FIG. 3 generates differential output signals y and y# having the same rise and fall slopes which are smooth, i.e. not stair case.

In one embodiment, transistors MP6, MP7 and MP8, MP9 are operated as source-followers to enhance the linearity of the waveforms of y and y#. Coupling the two transistors (MP6, MP7 and MP8, MP9) in series emulates a long-channel transistor device. In one embodiment, transistors MP6, MP7 and MP8, MP9 may be removed.

In one embodiment, the slew rate of the controls signal 107, i.e. signals y and y#, increases when tune signal level is increased and/or when Vbn voltage level is increased and Vbp voltage level is reduced. In such an embodiment, Vbp is indirectly controlled by a bias current provided by transistors MN1/MP1 which are part of current mirrors. As the slew rate of signals y and y# increases, i.e. slew rate of control signal 107, the delay from signals d/d# to y/y# is reduced, which results in higher frequency.

In one embodiment, the value of VH and VL can be chosen independently from the power supply used for the delay element 200. In such an embodiment, the power levels of VH and VL are greater than −Vtn and less than Vccags+Vtp to make sure the switches in the matrix can be turned off, where "Vccags" is the power supply of the delay elements, and where Vtp and Vtn are threshold voltages for a P-type transistor and N-type transistor respectively. In one embodiment, Vccags=1V, VH=0.8V, and VL=0.2V. In other embodiments, other voltages may be used for Vccags, VH, and VL.

Figure 4A:
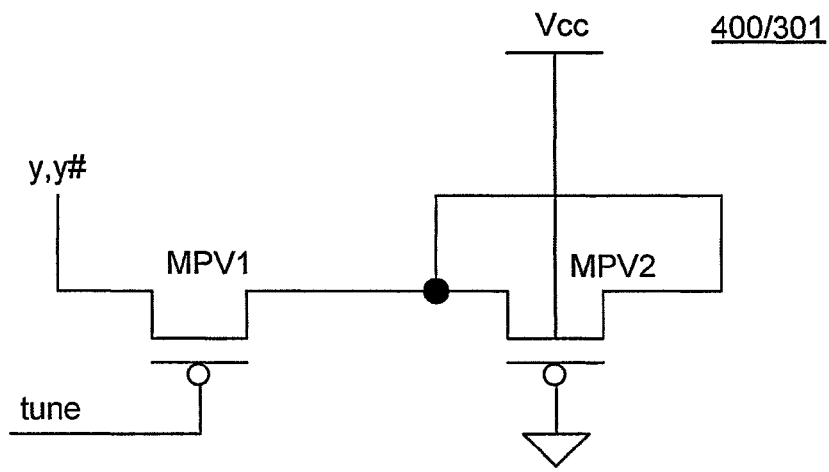
FIG. 4A is a schematic of a varactor in a delay cell of the delay element, according to one embodiment of the invention.

FIG. 4A is a schematic of a varactor 400/301 in the delay cell 300, according to one embodiment of the invention. So as not to obscure the embodiments of the invention, the embodiment of FIG. 4A shows a single varactor coupled to either the output node carrying signals y or y#. However, each output node of the delay cell 300 (output nodes carrying signals y and y# signals) are coupled to an individual varactor.

In one embodiment, the varactor 400/301 comprises two PMOS transistors MPV1 and MPV2. In one embodiment, the first PMOS transistor MPV1 has a source/drain terminal which couples to the output node carrying y or y#. In one embodiment, the second PMOS transistor MPV2 is coupled to the first PMOS transistor MPV1 such that the source/drain terminal of MPV1 is coupled to the source and drain terminals of MPV2, where the source and drain terminals of MPV2 are shorted to one another to form a capacitor. In one embodiment, the gate terminal of MPV2 is coupled to ground. In another embodiment, the gate terminal of MPV2 may be biased at another voltage level. In one embodiment, the bulk/body terminal of MPV2 is tied to a high power supply, e.g. Vcc. In one embodiment, the varactor has a tunable capacitance caused by the tune signal coupled to the gate terminal of MPV1. In one embodiment, changing the capacitance of the varactor changes the slope of the delay cell 300.

While the varactor of FIG. 4A is described with reference to PMOS transistors, transistors MPV1 and MPV2 may be replaced with NMOS transistors to achieve the same purpose.

Figure 4B:
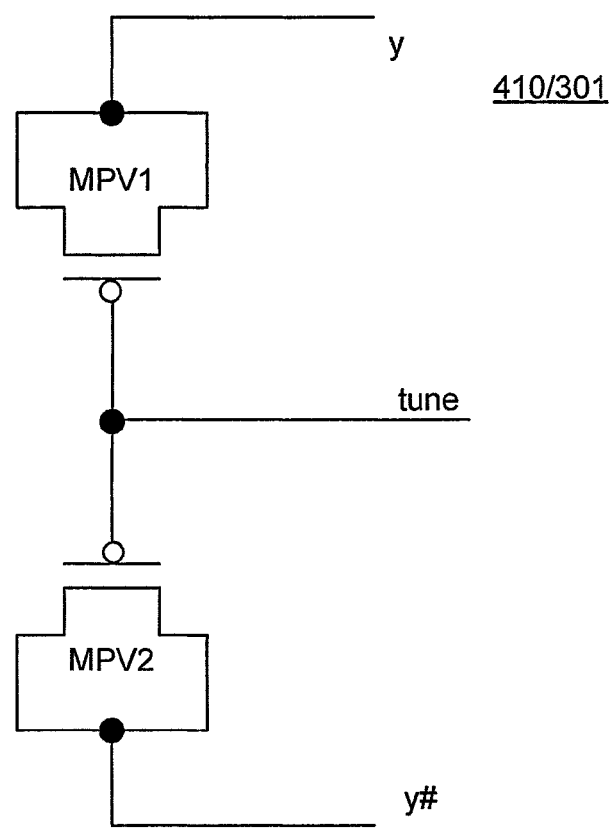
FIG. 4B is a schematic of a varactor in a delay cell of the delay element, according to another embodiment of the invention.

FIG. 4B is a schematic of a varactor 410/301 in a delay cell of the delay element, according to another embodiment of the invention. In this embodiment, the nodes y and y# (carrying signals y and y#) are coupled to gates of corresponding PMOS transistors MPV1 and MPV2 respectively. In this embodiment, the tune signal is used to change the capacitance of transistors MPV1 and MPV2.

Figure 5A:
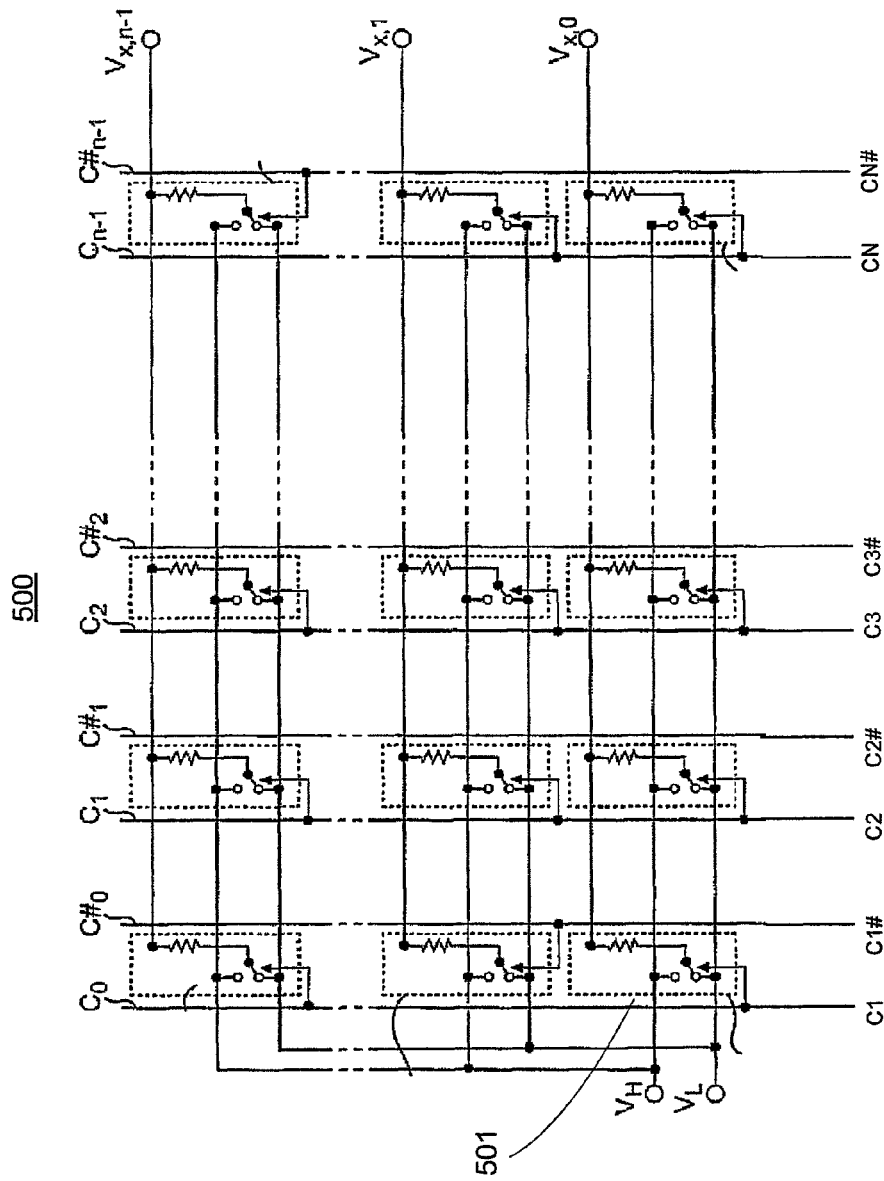
FIG. 5A is a high level architecture of an array of switch-resistors in the signal generator, according to one embodiment of the invention.

FIG. 5A is a high level architecture 500 of an array of switch-resistors 102 in the signal generator 100, according to one embodiment of the invention. So as not to obscure the embodiments of the invention, only a few columns of switch-resistors are shown with a simplified switch-resistor cell 501. The control signals at the bottom refer to the control signals C1, C1#; C2, C2#; CN, CN#, etc as discussed with reference to FIG. 1, which are generated by the RO 101. As shown in FIG. 5A, each switch-resistor receives VH and VL signals and the output of each row of switch-resistors is similar to the VxTri signal and are labeled Vx,0; Vx,1; ... and Vx,(n−1) for each row. In one embodiment, each output signal—Vx,0; Vx,1; ... and Vx,(n−1)—is input to an individual comparator (like comparator 103) which also receives a Vth signal.

FIGS. 5B-C are high level architectures 510 and 520 of a switch-resistor 501, according to one embodiment of the invention.

FIG. 5B is an embodiment of a switch-resistor topology with a single resistor 513 coupled between the node Vx 516 (e.g., Vx,0, Vx, 1, etc) and node 517. In this embodiment, a first switch 511 (a transistor) is positioned between node 517 and node 514 which receives VH. In this embodiment, a second switch 512 (another transistor) is positioned between node 517 and node 515 which receives VL. The gate terminals of the first 511 and second 512 switches are controlled by the complementary control signals C1 and C1# respectively.

In one embodiment, the rows of the switch-matrix 102 are designed to have particular output impedance. For example, the output impedance is designed to be in the range of a few 100 Ohms to approximately 1 kOhms. This output impedance results from the parallel connection of resistors 513 of all columns of the switch-matrix 102. In one embodiment, the value of resistor 513 is selected to be the output impedance times the number of columns (e.g., 32 or 64) of the switch-matrix 102. In one embodiment, the value of the resistor 513 is achieved by adding dummy pass transistors and/or pass gates at either terminal of resistor 513 and/or either of the terminals of switches 511 and 512. In one embodiment, the value of resistor 513 is not precise, i.e. it can be within a tolerance range (e.g., within 20%).

The impedance level of the switch-matrix rows can be chosen lower to improve speed (high-frequency operation), or it can be chosen higher to reduce the power consumption in the switch-matrix 102, according to one embodiment of the invention.

FIG. 5C is another embodiment of a switch-resistor topology with multiple resistors 523a-c. A first resistor 523a is coupled between the node Vx 516 (e.g., Vx,0, Vx, 1, etc) and node 527. In this embodiment, a first switch 521 (a transistor) is positioned between node 527 and node 514 which receives VH. A second resistor 523b is coupled between node 527 and a source/drain terminal of the first switch 521. In this embodiment, a second switch 522 (another transistor) is positioned between node 527 and node 515 which receives VL. The combination of the first switch 521 and the first resistor 523a forms a first resistor-switch. The combination of the second switch 522 and the second resistor 523a forms a second resistor-switch. The gate terminals of the first 521 and second 522 switches are controlled by the complementary control signals C1 and C1# respectively.

In one embodiment, the first and second resistor-switches comprise at least one of: a pass-gate including n-type and p-type transistors coupled in parallel to one another; an n-type transistor only; and a p-type transistor only. In one embodiment, the first and second resistor-switches comprise two pass-gates, one acting like a switch controllable by the complementary control signals C1 and C1#, and the other acting like a resistor which is always on. In one embodiment, the pass-gates of the first and second resistor-switches are coupled to additional p-type transistor in series with the pass-gate. In one embodiment, the pass-gates of the first and second resistor-switches are coupled to additional n-type transistor in series with the pass-gate. In one embodiment, the pass-gates of the first and second resistor-switches are coupled to additional n-type and p-type transistors in series with the pass-gate.

In one embodiment, an additional resistor—a third resistor 523c—is coupled between node 527 and the first and second resistor-switches. In one embodiment, the value of the resistors ranges from a few 1 KOhms to approximately 10 kOhms.

Figure 6:
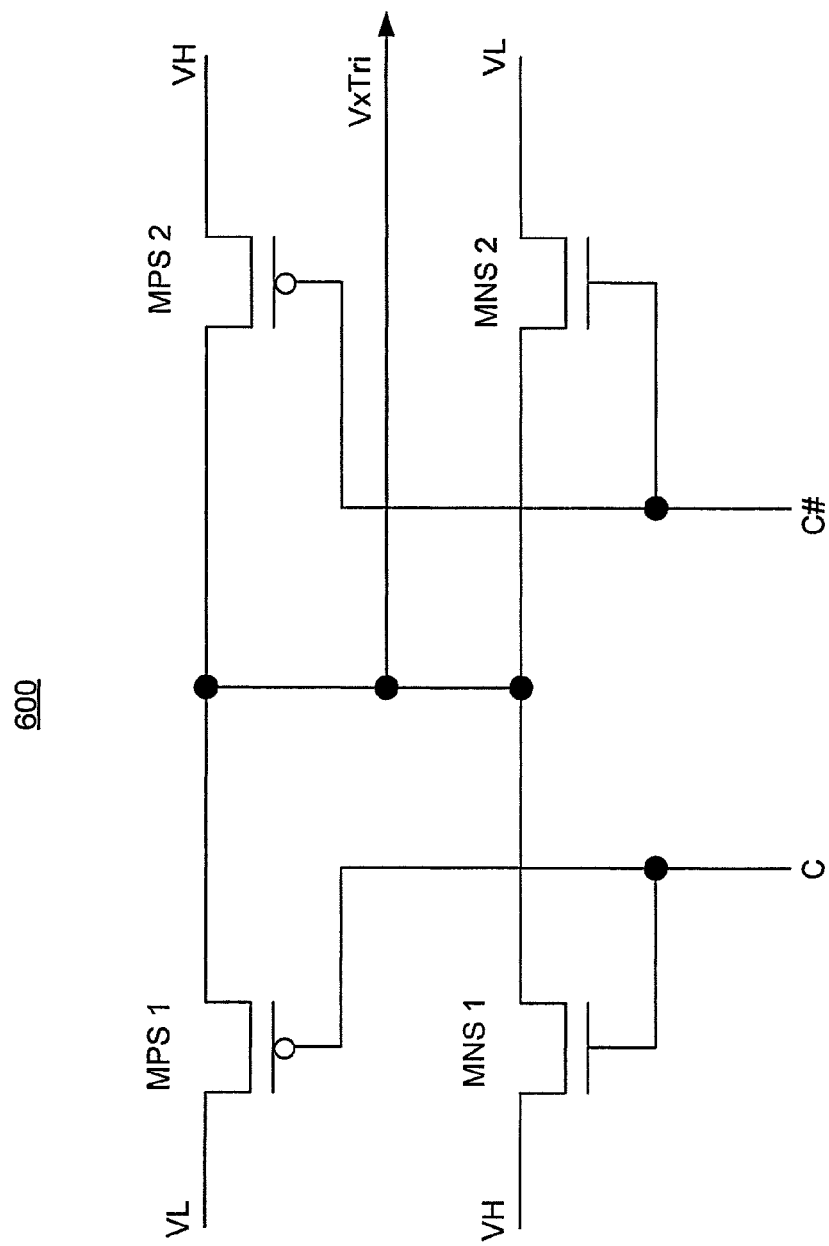
FIG. 6 is a schematic of a switch-resistor core, according to one embodiment of the invention.

FIG. 6 is a schematic of a switch-resistor core 600, according to one embodiment of the invention. FIG. 6 is a version of FIG. 5B without resistor 523c. FIG. 6 is the functional equivalent of FIG. 5B assuming a break-before-make operation of the switches in FIG. 5B.

The switch-resistor core 600 comprises a multiplexer-like circuit topology with VH and VL being inputs which are selectable by control signals C and C#, which correspond to signal 107 (e.g., C1, C1#), and VxTri signal being the output signal (e.g., Vx,0; Vx,1 of FIGS. 5A-C). The transistors discussed herein are referred with labels "first," "second," third," etc for ease of describing the embodiments.

In one embodiment, the select control signal C is received as input to the gate terminals of a first PMOS transistor MPS1 and a first NMOS transistor MNS1. The source/drain terminal of MPS1 receives signal VL while its other drain/source terminal is coupled to a drain/source terminal of a second PMOS transistor MPS2 and to the output node carrying VxTri signal. The source/drain terminal of the first NMOS transistor MNS1 receives signal VH while its other drain/source terminal is coupled to a drain/source terminal of the second NMOS transistor MNS2 and to the output node carrying the VxTri signal.

In one embodiment, the select control signal C#, which is complementary signal of C, is received as input to the gate terminals of the second PMOS transistor MPS2 and the second NMOS transistor MNS2. The source/drain terminal of the second PMOS transistor MPS2 receives signal VH while its other drain/source terminal is coupled to a drain/source terminal of the first PMOS transistor MPS1 and to the output node carrying the VxTri signal. The source/drain terminal of the second PMOS transistor MNS2 receives signal VL while its other drain/source terminal is coupled to a drain/source terminal of the first NMOS transistor MNS1 and to the output node carrying the VxTri signal.

While the embodiment of FIG. 6 illustrates single transistors, they can be replaced with transmission gates having PMOS and NMOS transistors coupled in parallel to another. For example, the NMOS transistors coupled to VH can be pass gates while the PMOS transistor receiving VL can continue to be regular single transistor pass gates. Any combination of pass-gates and single transistor pass gates may be used and corresponding control signals may be re-wired to realize the same truth table of the embodiment of FIG. 6.

Figure 7:
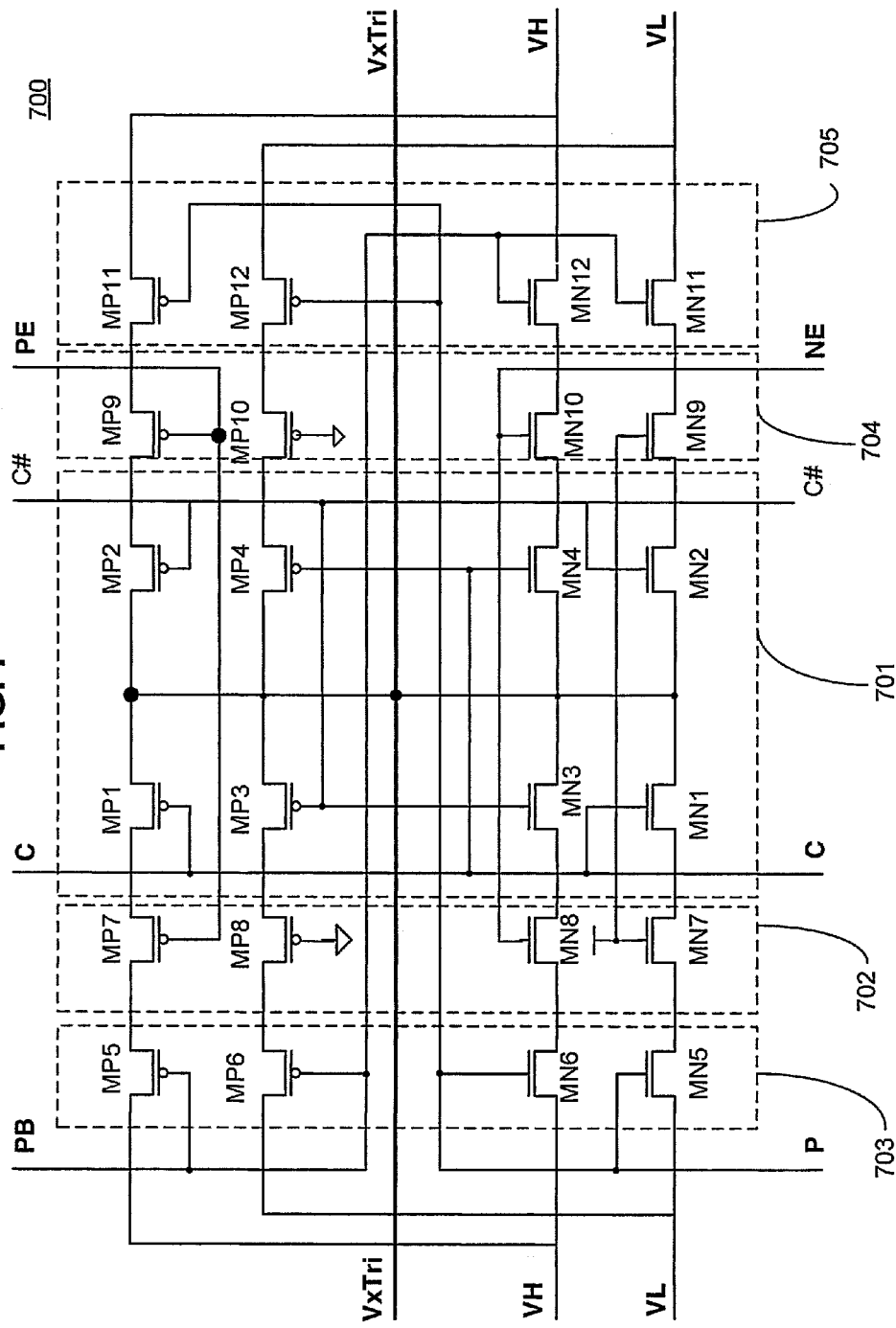
FIG. 7 is a schematic of a switch-resistor cell having the switch-resistor core, according to one embodiment of the invention.

FIG. 7 is a schematic of a switch-resistor cell 700 having the switch-resistor core 701, according to one embodiment of the invention. In one embodiment, the switch-resistor cell 700 comprises the switch-resistor core 701. The switch-resistor core 701 comprises NMOS transistors MN1-MN4 and PMOS transistors MP1-MP4 which are operable to be selected by control signals C and C# to pass VH or VL as the VxTri signal. The switch-resistor core 701 is similar to the switch-resistor 600 of FIG. 6. In one embodiment, the transistors MN7 and MN9 are always ON to control the resistance of the RC filter formed by the switch-resistor cell 701.

In one embodiment, the switch-resistor cell 701 is operable to be disabled when the phase of the switch-resistor cell is not being used. In such an embodiment, the VxTri signal is tri-stated. The disabling and enabling of the switch-resistor cell 701 is performed by transistors in blocks 702 and 704. This capability in the switch-resistor cell 701 allows for selectively enabling or disabling of the switch-resistor cells in the switch-resistor array 102 to reduce power consumption when needed. For example, when a phase generated by the switch-resistor cell is not being used, the switch-resistor cell associated with that phase can be disabled.

In one embodiment, blocks 702 and 704 comprise NMOS transistors MN8 and MN10 to block the passing of VH and VL as the VxTri signal via the switch-resistor cell 701. In one embodiment, the passing of VH and VL is blocked by disabling the NMOS transistors MN8 and MN10 via signal NE. In this embodiment, blocks 702 and 704 also comprise PMOS transistors MP7 and MP9 to block the passing of VH and VL as VxTri via the switch-resistor cell 701 by disabling the PMOS transistors MP7 and MP9 via signal PE. The signal PE is complementary to the signal NE. In one embodiment transistors MN7, MN9, MP8, and MP10 are always turned on to control the resistance in the RC filter of the switch-resistor cell 701. In one embodiment, signals NE and PE are generated by the circuit discussed with reference to FIG. 9. In one embodiment, transistor MP8 is positioned between transistors MP2 and MP4 such that transistor MP2 couples to transistor MP6 via their respective source/drain terminals. By positioning transistor MP8 between transistors MP2 and MP4, additional RC filtering is achieved by the switch-resistor cell 701 resulting in smoother VxTri signal. In one embodiment, transistor MP10 is positioned between transistors MP2 and MP4 such that transistor MP4 couples to transistor MP12 via their respective source/drain terminals. By positioning transistor MP12 between transistors MP2 and MP4 additional RC filtering is achieved by the switch-resistor cell 701 resulting in smoother VxTri signal.

In one embodiment, transistor MN7 is positioned between transistors MN1 and MN2 such that transistor MN1 couples to transistor MN5 via their respective source/drain terminals. By positioning transistor MN7 between transistors MN1 and MN2 additional RC filtering is achieved by the switch-resistor cell 701 resulting in smoother VxTri signal. In one embodiment, transistor MN9 is positioned between transistors MN1 and MN2 such that transistor MN1 couples to transistor MN9 via their respective source/drain terminals. By positioning transistor MN9 between transistors MN1 and MN2 additional RC filtering is achieved by the switch-resistor cell 701 resulting in smoother VxTri signal.

In one embodiment, the switch-resistor core 700 further comprises blocks 703 and 705 having transistors which are controllable by signals P and PB. Signal PB is complementary of signal P. The transistors controlled by the signal P include NMOS transistors MN5 and MN6, and PMOS transistors MP11 and MP12. The transistors controlled by the signal PB include NMOS transistors MN11 and MN12, and PMOS transistors MP5 and MP6. In this embodiment, signals P and PB are used for adjusting phase angle of the phase generated by the switch-resistor cell 701 by functionally changing the polarities of C and C# signals. This embodiment allows for changing the phase angle of the VxTri signal on the fly.

In one embodiment, phase angle of the phase generated by the switch-resistor cell 701 can be adjusted by changing the actual, as opposed to functionally, polarities of C and C# signals for each row of the switch-resistor matrix 102. In another embodiment, the function of the control signals C and C# are changed, i.e. inverted, inside each switch-resistor cell or row/column. In such an embodiment, signals P and PB change the function of signals C and C#. In this embodiment, the change in the function of C and C# occurs in the switch-resistor matrix 102 rather than the delay elements of the RO 101.

Figure 8:
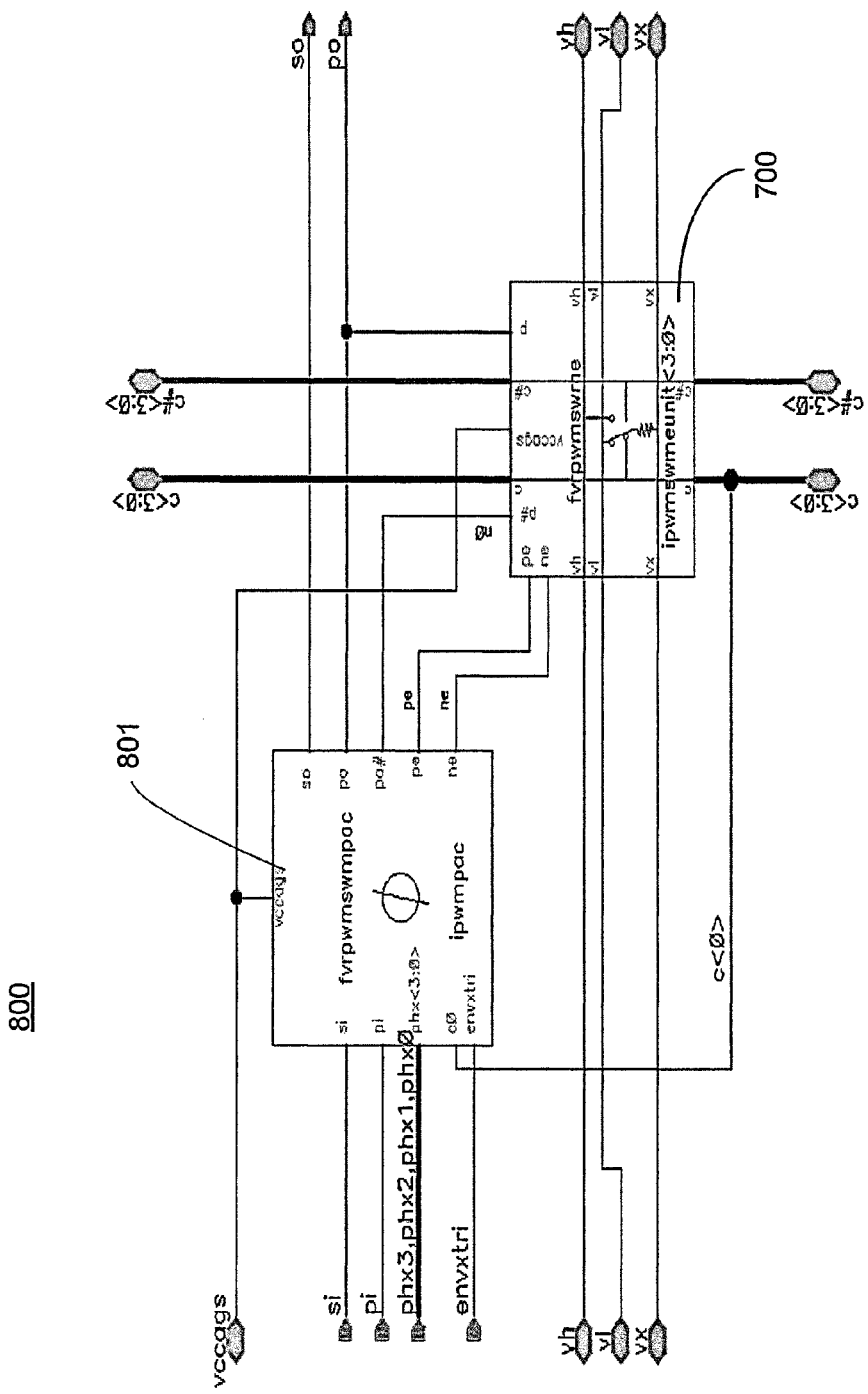
FIG. 8 is a high level architecture of a switch-resistor cell having a phase angle control logic block, according to one embodiment of the invention.

FIG. 8 is a high level architecture 800 of the switch-resistor cell 501 having a phase angle control logic block 801, according to one embodiment of the invention. In one embodiment, the phase angle control logic block 801 generates the signals PE and NE to enable or disable the switch-resistor core 700, where disabling the switch-resistor core 700 comprises tri-stating the VxTri signal. In one embodiment, the input Si is provided by another switch-resistor cell 501 via its output So. The signal So is used for generating the enable/disable signals NE and PE to control power consumption of the switch-resistor cell 501. In one embodiment, the signal So is asserted before a phase is enabled.

In one embodiment, the Pi signal is input to the phase angle control logic block 801 and is the Po output from the previous switch-resistor cell 501 of the switch-resistor array 102. In one embodiment, when Pi is logically 0, then Po is logically 0 unless the output of the NAND gate 901 is low, i.e. this column is being addressed by the phase angle control code. In one embodiment, this causes the function of signals C and C# for this column in the row to be inverted. In one embodiment, when Pi is logically 1, then Po is logically 1. Since this applies to all following columns (in daisy-chain topology), it means that the function of signals C and C# for those columns is inverted. The number of columns for which the function of signals C and C# is inverted determines the amount of phase shift.

In one embodiment, the phase angle control logic block 801 also receives a matrix enable signal enVxTri which is used for enabling or disabling a row or a column of switch-resistors in the switch-resistor array 102. In one embodiment, the signal c<0> is used to generate a synchronization signal from each clock phase. In this embodiment, the signal c<0> in the column addressed by phase angle control code changes state (from logical 1 to logical 0 or from logical 0 to logical 1) right at the peak of the triangle waveform Vxtri, that is, at times t_H and t_L in FIG. 10.

Figure 9:
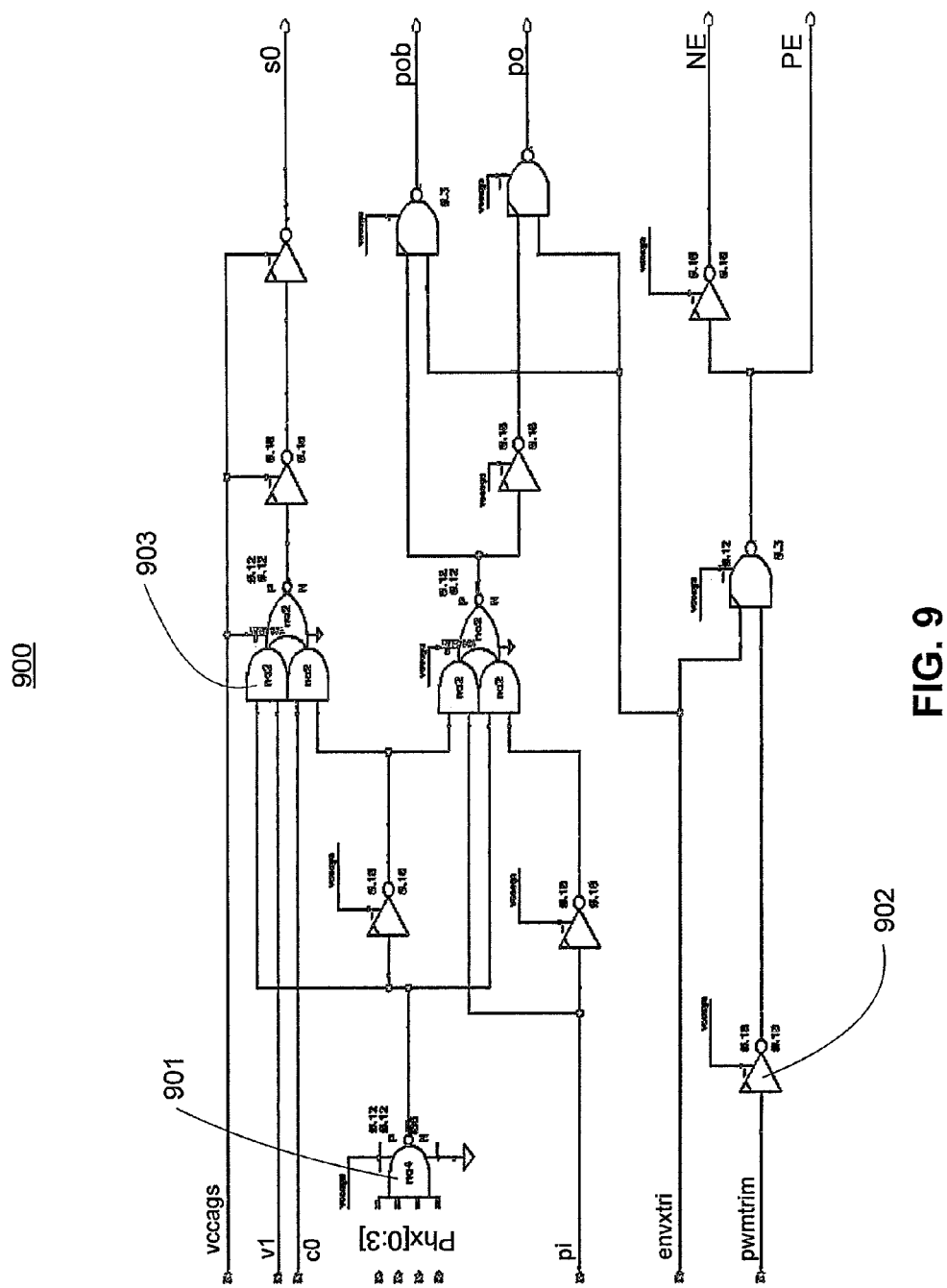
FIG. 9 is a schematic of the phase angle control logic block, according to one embodiment of the invention.

FIG. 9 is a schematic 900 of the phase angle control logic block 800, according to one embodiment of the invention. The schematic comprises three types of logic gates including a NAND gate 901, an inverter 902, and a complex gate 903. The complex gate is functionally a 4 input NAND gate. The schematic is a combinational logic which implements the truth table shown by Table 1 herein. The embodiment of 900 can be implemented with other logic gates without changing the essence of the embodiments of the invention.

TABLE 1

Truth Table for Logic 900 of FIG. 9

| Envx | Pwm trim | Pi | Phx [3:0] | Si | C0 | Po | Pob | S0 | PE | NE | comments |
|---|---|---|---|---|---|---|---|---|---|---|---|
| 0 | 0 | x | x | x | x | 0 | 0 | 0 | 1 | 0 | row disabled |
| 1 | 0 | Pi | ≠ 1111 | Si | x | Pi | Pib | Sib | 1 | 1 | |
| 1 | 0 | Pi | 1111 | Si | C0 | Pib | Pi | C0 | 0 | 1 | phase synchronized to this column |
| x | 1 | Pi | ≠ 1111 | Si | x | Pi | Pib | Sib | 0 | 1 | Row disabled |
| x | 1 | Pi | 1111 | Si | C0 | Pib | Pi | C0 | 1 | 0 | Row disabled |

The signals Pib and Pi are complementary signals, i.e. Pib is the inverted version of Pi. The signals Si and Sib are also complementary signals. Signals PE and NE are complementary signals. Signals Po and Pob are complementary signals. The term 'x' refers to logical don't care state. In one embodiment, Envx and Pwmtrim are used to disable a matrix row (e.g., to save power) and NE/PE are the respective control signals going into the switch-resistor cell. In this embodiment, Pi and Po are used for the daisy-chain logic, and Po together with Pob are the control signals going to the switch-resistor cell to control the inversion of C and C#. In this embodiment, Si and So are used to generate the phase enable synchronization signals using a daisy-chain configuration. In this embodiment, Phx[3:0] is the respective subset of the true and inverse bits of the phase angle control code for this column (inputs to the NAND gates 901—much like in a decoder).

Figure 10:
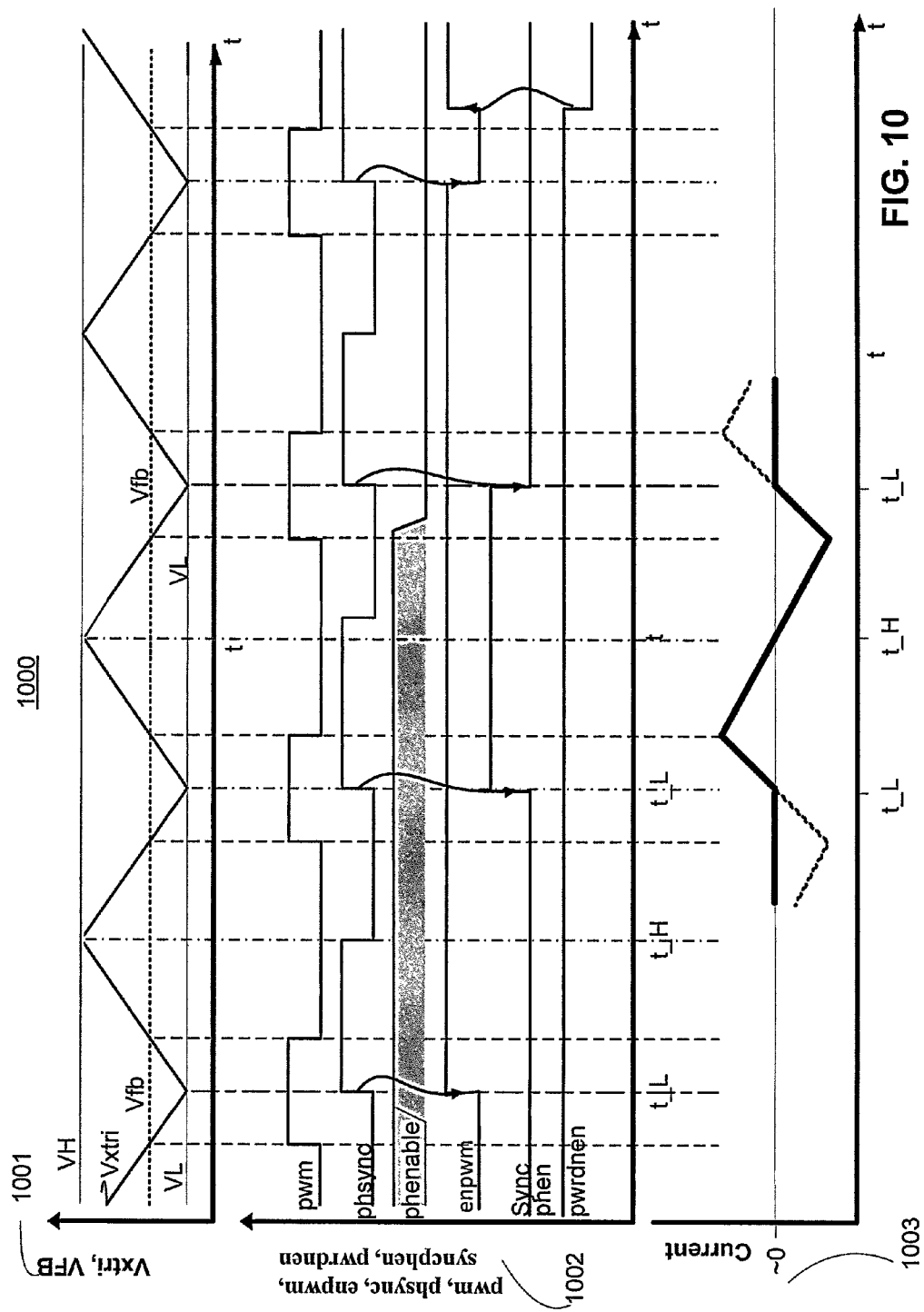
FIG. 10 is a phase angle synchronization timing diagram, according to one embodiment of the invention.

FIG. 10 is a phase angle synchronization timing diagram 1000, according to one embodiment of the invention. There are three subplots shown in FIG. 10. The vertical dotted lines show the cause and effect.

The top subplot 1001 is a voltage vs. time graph. The subplot 1001 shows the smooth triangular waveform output VxTri from the array of switch-resistors 102. The top subplot 1001 also shows the relative DC voltage levels of signals VH, VL, and Vfb (same as Vth).

The middle subplot 1002 is a voltage vs. time graph. The subplot 1002 shows the PWM signal 106 generated by comparing Vfb (same as Vth) with Vxtri by the comparator 103. As shown by the cause-effect vertical dotted lines, when Vfb and Vxtri intersect, the PWM signal 106 asserts or de-asserts forming a square wave. The signal below the PWM signal 106 is the phsynd signal which is the same as So signal discussed herein. The So signal asserts when the Vxtri signal changes direction. For example, the So asserts when the VxTri signal reaches its minimum value and it de-asserts when the VxTri signal reaches its maximum voltage level. The signal below the phsynd signal is the phenable (phase enable) signal. In one embodiment, phsynd and phenable signals change when the power supply is turned on or turned off. In such an embodiment, phenable for some or all phases is asserted or de-asserted, respectively. In one embodiment, according to the anticipated load current more or fewer phases can be enabled in order to maximize efficiency.

The signal below the phenable signal is the enpwm signal which enables or disables the switch-resistors in the switch-resistor array 102. In one embodiment, enpwm may also enable and/or disable the comparator 103. The enpwm signal is generated in response to the assertion of the so signal, according to one embodiment. The signal enpwm is the same as the signals PE and NE. In one embodiment, the enpwm signal is asserted before the phenable signal is asserted because the PWM signal 106 is valid before the phase of the PWM signal 106 is enabled via the phenable signal.

The bottom subplot 1003 is a current vs. time graph. The solid curve shows the current though an inductor (not shown) as it rises and falls controlled by the PWM signal. The timing of the solid curve through the syncphen signal, i.e. when the current begins to rise and fall and when the current returns to zero, controls the overshoot and/or undershoot of the inductor (not shown) voltages. The inductors receive the PWM signal 106 via a driver (not shown). In one embodiment, the output of the inductors forms the power supply output supplied to the processor.

Figure 11:
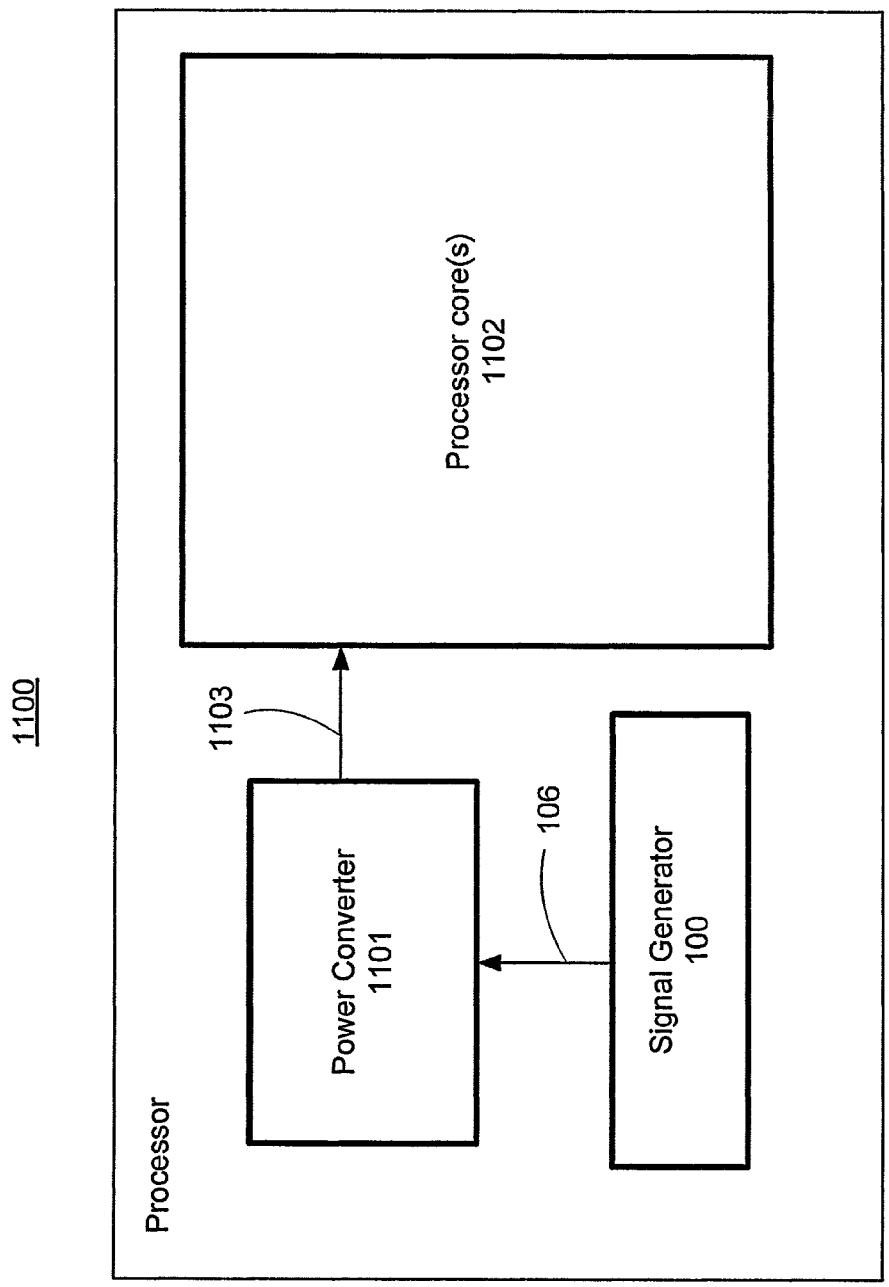
FIG. 11 is a processor with the signal generator, according to one embodiment of the invention.

FIG. 11 is a processor 1100 with the signal generator 100, according to one embodiment of the invention. In one embodiment, the output 106 of the signal generator 100 is received by a power converter 1101. In one embodiment, the power converter 1101 is a DC-DC power converter that together with voltage regulator (not shown) generates one or more power supplies 1103 for the processor core(s) 1102. In one embodiment, the processor 1100 is a single die with one or more hardware processing cores 1102, wherein the signal generator 100 and the DC-DC power converter 1101 are positioned within the same die 1100. In other embodiments, the power converter 1101 and/or the signal generator 100 may be positioned in an integrated package containing the processor 1100. Embodiments of the present invention may be provided in or for multiphase and/or multi-output integrated DC-to-DC converters that switch at frequencies of up to several 100 MHz. In one embodiment, the processor 1100 is coupled to a wireless interface 360 to interface the system 300 with other systems, networks, and/or devices via a wireless connection such as an antenna. The wireless interface 360 may link the processor 1100 to a wireless network.

Figure 12:
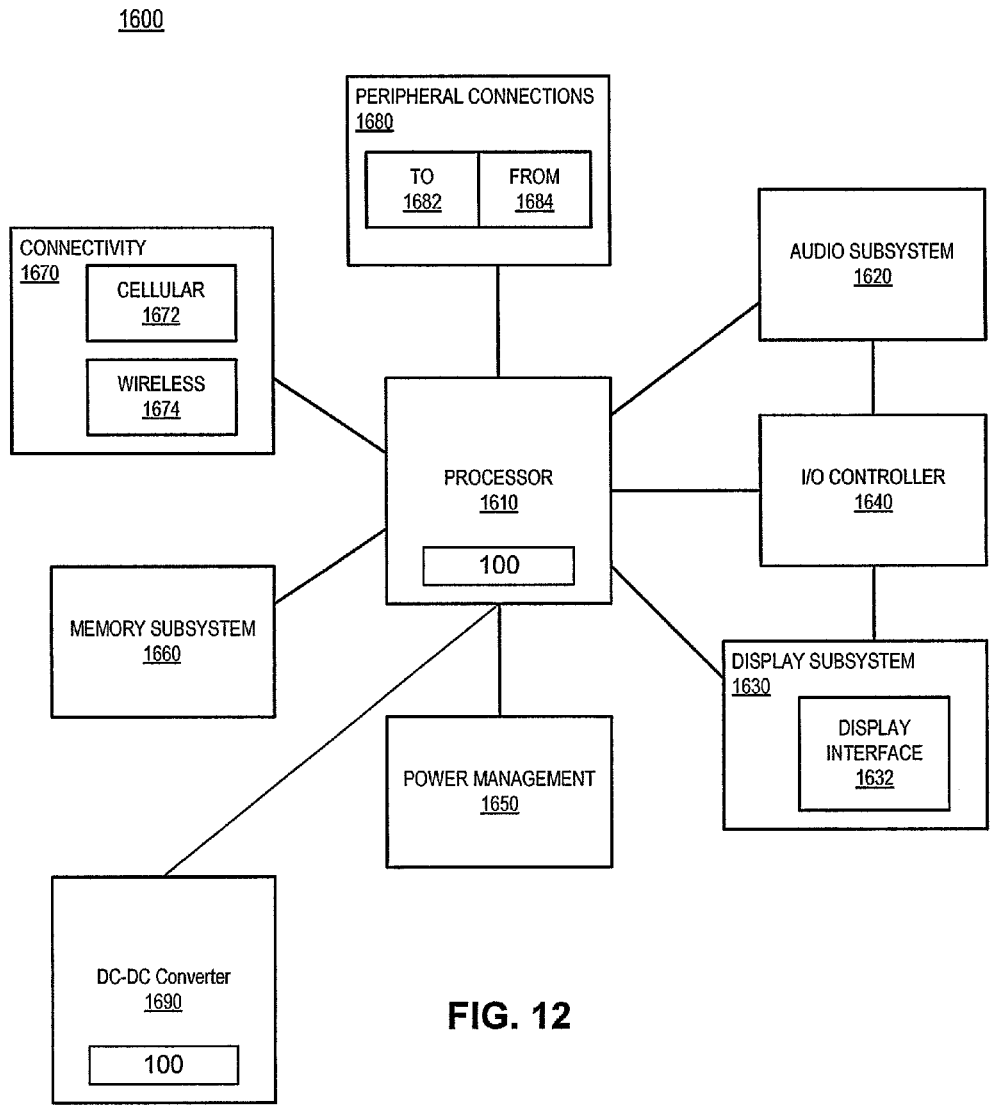
FIG. 12 is a system-level diagram of a smart device comprising a processor and a DC-DC converter having the signal generator, according to one embodiment of the invention.

FIG. 12 is a system-level diagram of a smart device comprising a processor and a DC-DC converter having the signal generator, according to one embodiment of the invention. FIG. 12 also illustrates a block diagram of an embodiment of a mobile device in which flat surface interface connectors could be used. Computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

Device 1600 includes processor 1610 and DC-DC converter 1690. In one embodiment, the processor 1610 and/or the DC-DC converter 1690 include the signal generator 100 as discussed herein. In one embodiment, the DC-DC converter 1690 is operable to convert or shift an input DC voltage to an output DC voltage by means of the signal generated by the signal generator 100. The various embodiments of the present invention may also comprise a network interface within 1670 such as a wireless interface so that a system embodiment may be incorporated into a wireless device such as cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting device 1600 to another device. The processing operations may also include operations related to audio I/O and/or display I/O.

In one embodiment, device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to device 1600. In one embodiment, a user interacts with device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of device 1600. Additionally, audio output can be provided instead of or in addition to display output. In another example, if display subsystem includes a touch screen, the display device also acts as an input device, which can be at least partially managed by I/O controller 1640. There can also be additional buttons or switches on device 1600 to provide I/O functions managed by I/O controller 1640.

In one embodiment, the I/O controller 1640 manages devices such as accelerometers, cameras, light sensors or other environmental sensors, or other hardware that can be included in device 1600. The input can be part of direct user interaction, as well as providing environmental input to the system to influence its operations (such as filtering for noise, adjusting displays for brightness detection, applying a flash for a camera, or other features).

In one embodiment, device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of system 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable device 1600 to communicate with external devices. The device could be separate devices, such as other computing devices, wireless access points or base stations, as well as peripherals such as headsets, printers, or other devices.

Connectivity 1670 can include multiple different types of connectivity. To generalize, device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that device 1600 could both be a peripheral device ("to" 1682) to other computing devices, as well as have peripheral devices ("from" 1684) connected to it. Device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow device 1600 to control content output, for example, to audiovisual or other systems.

In addition to a proprietary docking connector or other proprietary connection hardware, device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an array of switch-resistors, each switch-resistor of the array to receive a control signal, wherein the array of switch-resistors is operable to generate an output signal, the array of switch-resistors comprising a switch-resistor core to receive control signals and a circuit coupled to the switch-resistor core to receive first signals other than the control signals to adjust a phase angle of the output signal; and
a ring oscillator having a plurality of delay elements coupled in a cascaded arrangement, each delay element to provide the control signal, wherein each delay element comprises
a first differential delay cell comprising an input, an output, a first differential pair of transistors coupled to the input to receive a first pair of differential input signals; and a second differential pair of transistors coupled to the input to receive a second pair of differential input signals, and to generate output signals at the output that is coupled to an input of a next delay element in the cascaded arrangement, and
a second differential delay cell to receive the output signal from the first differential delay cell, the second differential delay cell to generate the control signal.

2. The apparatus of claim 1, wherein the circuit is operable to configure the phase angle of the output signal according to a digital control bit pattern.

3. The apparatus of claim 1 further comprises a circuit for generating a synchronization signal according to the phase angle, wherein the synchronization signal is operable to control overshoot or undershoot of a voltage regulator signal.

4. The apparatus of claim 1, wherein the array of switch-resistors is operable to generate the output signal which is smooth.

5. The apparatus of claim 1, wherein the array of switch-resistors is operable to generate the output signal which is triangular and smooth.

6. The apparatus of claim 1, wherein the array of switch-resistors comprises columns and rows of switch-resistors.

7. The apparatus of claim 6, wherein each column or row of switch-resistors is operable to be powered-down.

8. The apparatus of claim 1, wherein each switch-resistor comprises:
a first p-transistor and a first n-transistor each having gate terminals coupled to a node having the control signal, and each having source terminals coupled to a node having the output signal, and wherein a drain terminal of the first p-transistor couples to a node having low voltage, and wherein a drain terminal of the first n-transistor couples to a node having a high voltage, which is higher than the low voltage.

9. The apparatus of claim 8, wherein each switch-resistor further comprises:
a second p-transistor and a second n-transistor each having gate terminals coupled to a node having a complementary version of the control signal, and each having drain terminals coupled to the node having the output signal,
wherein a source terminal of the second p-transistor couples to the node having the high voltage, and wherein a drain terminal of the second n-transistor couples to the node having the low voltage.

10. The apparatus of claim 1, wherein each delay element is operable to generate a control signal which is smooth.

11. The apparatus of claim 1, wherein the control signal has a slew rate which increases when a frequency of the ring oscillator increases.

12. The apparatus of claim 1, wherein each delay element is operable to generate complementary signals as the control signal, and wherein the circuit is operable to configure the phase angle of the output signal by changing a polarity of the complementary signals.

13. The apparatus of claim 1 wherein the first differential delay cell includes a varactor.

14. The apparatus of claim 1 further comprises:
a comparator to compare the output signal with a threshold voltage and to provide a pulse width modulated (PWM) signal, wherein the comparator is operable to be powered-down.

15. The apparatus of claim 1, wherein the array of switch-resistors comprises:
a weighted-sum circuit to receive an offset voltage and a plurality of control signals.

16. The apparatus of claim 15, wherein the weighted-sum circuit comprises a plurality of switch-resistor implementations, and wherein each of the switch-resistor implementations receives a separate subset of the plurality of the control signals from the ring oscillator.

17. The apparatus of claim 1 further comprises:
a second circuit to enable or disable a switching voltage regulated phase according to the phase angle, wherein each switch resistor comprises the circuit to configure the phase angle of the output signal.

18. An apparatus comprising:
an array of switch-resistors, each switch-resistor to receive a control signal, wherein the array of switch-resistors to generate an output signal; and
a circuit to configure a phase angle of the output signal,
a ring oscillator having a plurality of delay elements, each delay element to provide the control signal, wherein each delay element comprises
a first differential delay cell including a varactor; and
a second differential delay cell to receive an output signal from the first differential delay cell, the second differential delay cell to generate the control signal, and further wherein the varactor comprises:
a first transistor including:
a gate terminal coupled to a node having a tunable signal;
a drain terminal coupled to a node having the output signal from the first differential delay cell; and
a source terminal coupled to another transistor, wherein the other transistor comprises a second transistor including:
a gate terminal coupled to a node having a logical low signal; and
drain and source terminals coupled to one another and the source terminal of the first transistor.

19. A processor comprising:
a power converter for providing one or more power supplies to the processor; and
a signal generator coupled to the power converter, the signal generator including:
an array of switch-resistors, each switch-resistor to receive a control signal, wherein the array of switch-resistors to generate an output signal, the array of switch-resistors comprising a switch-resistor core to receive control signals and a circuit coupled to the switch-resistor core to receive first signals other than the control signals to adjust a phase angle of the output signal; and
a ring oscillator having a plurality of delay elements coupled in a cascaded arrangement, each delay element to provide the control signal, wherein each delay element comprises a first differential delay cell comprising an input, an output, a first differential pair of transistors coupled to the input to receive a first pair of differential input signals; and a second differential pair of transistors coupled to the input to receive a second pair of differential input signals, and to generate output signals at the output that is coupled to an input of a next delay element in the cascaded arrangement, and
a second differential delay cell to receive the output signal from the first differential delay cell, the second differential delay cell to generate the control signal.

20. The processor of claim 19 further comprises: one or more hardware processor cores.

21. The processor of claim 19, wherein the power converter is a DC-DC converter.

22. A system comprising:
a wireless connectivity;
a processor, communicatively coupled to the wireless connectivity, the processor including a signal generator, the signal generator comprising:
an array of switch-resistors, each switch-resistor to receive a control signal, wherein the array of switch-resistors to generate an output signal, the array of switch-resistors comprising a switch-resistor core to receive control signals and a circuit coupled to the switch-resistor core to adjust a phase angle of the output signal;
a display unit for displaying content processed by the processor; and
a ring oscillator having a plurality of delay elements coupled in a cascaded arrangement, each delay element to provide the control signal, wherein each delay element comprises
a first differential delay cell comprising an input, an output, a first differential pair of transistors coupled to the input to receive a first pair of differential input signals; and a second differential pair of transistors coupled to the input to receive a second pair of differential input signals, and to generate output signals at the output that is coupled to an input of a next delay element in the cascaded arrangement, and
a second differential delay cell to receive the output signal from the first differential delay cell, the second differential delay cell to generate the control signal.

23. The system of claim 22, wherein the display unit is a touch screen.

* * * * *